United States Patent
Lohninger

(10) Patent No.: US 6,218,906 B1
(45) Date of Patent: Apr. 17, 2001

(54) AMPLIFIER CIRCUIT

(75) Inventor: Gerhard Lohninger, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/520,278

(22) Filed: Mar. 6, 2000

Related U.S. Application Data

(63) Continuation of application No. PCT/DE98/02366, filed on Aug. 14, 1998.

(51) Int. Cl.$^7$ ........................................ H03F 3/04
(52) U.S. Cl. ............................ 330/311; 330/290
(58) Field of Search .................. 330/290, 302, 330/311, 85, 98, 99, 296

(56) References Cited

U.S. PATENT DOCUMENTS

| | | | |
|---|---|---|---|
| 3,493,882 | 2/1970 | Seader et al. | 330/28 |
| 4,237,414 | * 12/1980 | Stein | 330/297 |
| 4,940,949 | * 7/1990 | Landi | 330/311 |
| 5,404,585 | * 4/1995 | Vimpari et al. | 330/296 |
| 5,986,509 | * 11/1999 | Lohninger | 330/290 |

FOREIGN PATENT DOCUMENTS

| | | |
|---|---|---|
| 0718965A1 | 6/1996 | (EP) . |
| 4-369907 | 12/1992 | (JP) . |

OTHER PUBLICATIONS

Japanese Patent Abstract No. 52060047 (Mitsutoshi), dated May 18, 1977.
"Investigation of the Temperature Stability of a Broadband", A.V. Baranov et al., Telecommunications and Radio Engineering 43, Jul. 1988, No. 7, New York, pp. 148–150.
"Electronic Circuits—Design and Applications", U. Tietze et al., Springer–Verlag, pp. 439–440.

* cited by examiner

*Primary Examiner*—Robert Pascal
*Assistant Examiner*—Khanh Van Nguyen
(74) *Attorney, Agent, or Firm*—Herbert L. Lerner; Laurence A. Greenberg; Werner H. Stemer

(57) ABSTRACT

An amplifier circuit has a first transistor and a second transistor of a first conductivity type, which are operated in a cascode circuit together with a first resistor. In addition, the amplifier circuit includes a first capacitor, which precedes the control input of the first transistor. A third transistor of a second conductivity type is provided, whose control input is connected to one end of the controlled path of the second transistor and whose controlled path is connected on one end to a second supply potential. A fourth transistor of the second conductivity type is provided, whose control input is connected to the other end of the controlled path of the third transistor and whose controlled path is connected on one end to the control input of the third transistor. A second resistor is connected between the control input of the fourth transistor and one terminal of the first capacitor. Finally, a third resistor is connected between the other end of the controlled path of the fourth transistor and the other terminal of the first capacitor.

8 Claims, 1 Drawing Sheet

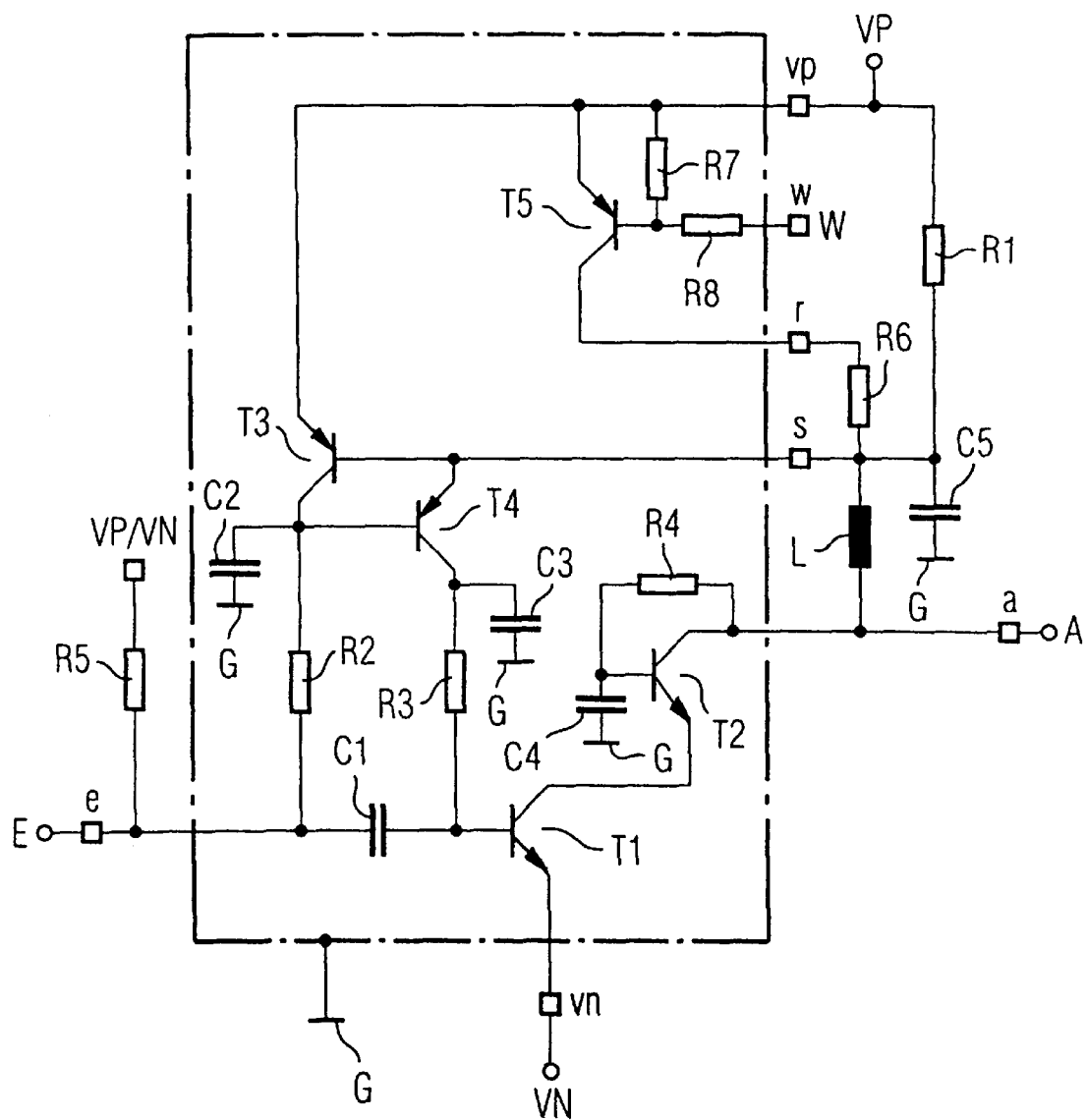

AMPLIFIER CIRCUIT

CROSS-REFERENCE TO RELATED APPLICATION

This is a continuation of copending International Application PCT/DE98/02366, filed Aug. 14, 1998, which designated the United States.

BACKGROUND OF THE INVENTION

FIELD OF THE INVENTION

The invention relates to an amplifier circuit having a first transistor of a first conductivity type, into whose control input an input signal is coupled and whose controlled path is connected at one end to a first supply potential. A second transistor of the first conductivity type is provided, to whose control input a bias potential is applied and whose controlled path is connected at one end to the other end of the controlled path of the first transistor and which outputs an output signal at its other end. The circuit has a first resistor, which is connected between the other end of the second transistor and a second supply potential.

One such amplifier circuit is generally designated as a cascode amplifier circuit and is known for instance from the publication by U. Tietze, Ch. Schenk, titled "Electronic Circuits", 1991, pages 439 and 440. Cascode amplifier circuits are distinguished by a high input resistance and by the elimination of the Miller effect. However, they are vulnerable to component parameter fluctuations, temperature fluctuations, and voltage fluctuations.

SUMMARY OF THE INVENTION

It is accordingly an object of the invention to provide an amplifier circuit which overcomes the above-mentioned disadvantages of the prior art devices of this general type, in which component, temperature and voltage fluctuations exert less of an influence.

With the foregoing and other objects in view there is provided, in accordance with the invention, an amplifier circuit, containing:

a first transistor of a first conductivity type having a control input receiving an input signal and a controlled path having a first end to be connected to a first supply potential and a second end;

a second transistor of the first conductivity type having a control input receiving a bias potential and a controlled path with a first end connected to the second end of the controlled path of the first transistor and a second end outputting an output signal; and a first resistor having a first terminal connected to the second end of the controlled path of the second transistor and a second terminal to be connected to a second supply potential;

a capacitor having a first terminal connected to the control input of the first transistor and a second terminal;

a third transistor of a second conductivity type having a control input connected to the second end of the controlled path of the second transistor and a controlled path with a first end to be connected to the second supply potential and a second end;

a fourth transistor of the second conductivity type having a control input connected to the second end of the controlled path of the third transistor and a controlled path with a first end connected to the control input of the third transistor and a second end;

a second resistor connected between the control input of the fourth transistor and the second terminal of the capacitor; and a third resistor connected between the second end of the controlled path of the fourth transistor and the first terminal of the capacitor.

The third and fourth transistors, together with the second and third resistors form a stabilizing stage to regulate the operating point of the cascode stage. The voltage in the input circuit of the third transistor, that is, the voltage across the first resistor, is used as an input variable, and the current through the first resistor is regulated by the stabilizing circuit. In this way, fluctuations in component parameters, in the temperature, and in the supply voltage are leveled.

Preferably, the control input of the fourth transistor is coupled via a second capacitor to the first supply potential, and/or the other end of the controlled path of the fourth transistor is coupled to the first supply potential via a third capacitor. The second and third capacitors serve in particular to block off high-frequency alternating signals.

Preferably, the bias potential for the control input of the second transistor is generated by a fourth resistor connected between the control input and the other end of the controlled path of the second transistor. To suppress high-frequency alternating components, a fourth capacitor can be connected between the control input of the second transistor and the first supply potential.

On the basis of the stabilizing stage, the operating range of the amplifier circuit of the invention can be varied arbitrarily. On the one hand, it is possible in a simple way to turn the entire amplifier circuit on and off. To do so, the first or second supply potential is simply applied to the node point between the second resistor and the first capacitor via a fifth resistor. If the second supply potential is applied, then the stabilizing circuit is deactivated, and the cascode stage is made currentless via the stabilizing stage. The entire amplifier circuit is thus turned off. If the first supply potential is applied, the stabilizing circuit functions normally. The fifth resistor then serves to decouple the high-frequency signals at the input and is preferably embodied with high impedance.

Along with turning the circuit on and off, the operating point can also be shifted arbitrarily. This is done by varying the resistance of the first resistor. To vary the resistance, preferably a sixth resistor is connected in parallel with the first resistor via a controlled switch. Accordingly, a switchover can be made between two operating points. The operating points can be defined such that with the resistors connected in parallel, the amplifier circuit functions in the normal mode, while if only one resistor is used a state of repose with a predefined resting current is maintained.

The amplifier circuit of the invention is suitable particularly for high-frequency applications. Preferably, the transistors used are of the bipolar type. In this case, one end of the applicable controlled path is formed by the emitter and the other end of the applicable controlled path is formed by the collector, and the control input is formed by the base.

Other features which are considered as characteristic for the invention are set forth in the appended claims.

Although the invention is illustrated and described herein as embodied in an amplifier circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE of the drawing is a circuit diagram of an amplifier circuit according to the invention.

DESCRIPTION OF THE PREFERRED EMBODIMENTS

Referring now to the single FIGURE of the drawing in detail, there is shown an exemplary embodiment of an amplifier that has a cascode stage with a bipolar transistor T1 of the npn type, whose emitter is connected to a terminal vn. A negative supply potential VN is applied to the terminal vn. An emitter of a bipolar transistor T2 of the npn type is connected to a collector of the transistor T1, and a collector of the transistor T2 is connected on the one hand to an output terminal a and on the other to its own base via a resistor R4. The base is also connected to ground G via a capacitor C4. The negative supply potential VN is connected to ground G. The resistor R4 generates a bias potential at the base of the transistor T2, and by a capacitor C4, high-frequency alternating components that appear at the base of the transistor T2 are short-circuited. The output terminal a, at which an output signal A can be picked up, is connected via an inductive resistor L to a control terminal s, which is moreover coupled via a resistor R1 to a supply terminal vp and to a capacitor C5. The resistor R1 serves to adjust the operating point of the cascode stage, and the capacitor C5 short-circuits high-frequency alternating components. The inductive resistor L and the capacitor C5 consequently form a low-pass filter, which suppresses the high-frequency components in the output signal A and furnishes only low-frequency signal components at the control terminal s for adjusting the operating point.

To stabilize the respective operating point, a stabilizing stage is provided, which has a bipolar transistor T3 and a bipolar transistor T4, each of the pnp type, and two resistors R2 and R3. The transistor T3 is connected on the emitter side to the supply terminal vp and on the base side to the control terminal s. In the case of the transistor T4, the emitter is connected to the base of the transistor T3, and the base is connected to the collector of the transistor T3. A collector of the transistor T4 is coupled on the one hand to ground G via a capacitor C3 and to the base of the transistor T1 via a resistor R3. The base of the transistor T1 is moreover connected to an input terminal e via a capacitor C1. Finally, the collector of the transistor T3 is coupled to ground G via a capacitor C2 and to the input terminal e via a resistor R2. The control of the stabilizing stage is effected with the voltage that drops across the resistor R1. Via the transistors T3 and T4, the collector current through the transistors T1 and T2 and thus the current through the resistor R1 is leveled and stabilized.

Because of the capacitor C1, only alternating components reach the base of the transistor T1. If for instance the positive supply potential VP is now applied to the input terminal e via a resistor R5, than the base potential of the transistor T4 is raised to approximately its emitter potential, causing this transistor to block. The stabilizing stage is thus put out of action. Upon application of the negative supply potential VN, the stabilizing stage is operated in the normal way. Since the operating point depends on the resistance between the supply terminal vp and the control terminal s, this resistance can be varied by varying the resistor R1 or by connecting further resistors in parallel or series. In the present exemplary embodiment, the change in resistance is effected by connecting a further resistor R6 in parallel by use of a controllable switch. A bipolar transistor TS of the pnp type is used as the switch, with its emitter connected to the supply terminal VP, and its collector connected to a terminal r. The resistor R6 is connected between the terminal r and the control terminal s. The triggering of the transistor T5 is effected such that a corresponding control signal W is fed to a terminal w; the terminal w is coupled to the base of the transistor T5 via a resistor R8. The base of the transistor T5, for the sake of stability, is connected to the supply terminal vp via a resistor R7. If a potential that is substantially equal to the positive supply potential VP is present at the terminal w, then the transistor T5 blocks, and the resistance between the supply is terminal vp and the control terminal s is determined essentially by the resistor R1. If however the signal W is equal to the negative supply potential VN, then the transistor T5 switches through, and the resistance that determines the operating point is obtained from the parallel circuit of the resistors R1 and R6. Thus independently of one another, both two operating points and an on/off state can be adjusted.

I claim:

1. An amplifier circuit, comprising:
    a first transistor of a first conductivity type having a control input receiving an input signal and a controlled path having a first end to be connected to a first supply potential and a second end;
    a second transistor of the first conductivity type having a control input receiving a bias potential and a controlled path with a first end connected to said second end of said controlled path of said first transistor and a second end outputting an output signal; and
    a first resistor having a first terminal connected to said second end of said controlled path of said second transistor and a second terminal to be connected to a second supply potential;
    a capacitor having a first terminal connected to said control input of said first transistor and a second terminal;
    a third transistor of a second conductivity type having a control input connected to said second end of said controlled path of said second transistor and a controlled path with a first end to be connected to the second supply potential and a second end;
    a fourth transistor of the second conductivity type having a control input connected to said second end of said controlled path of said third transistor and a controlled path with a first end connected to said control input of said third transistor and a second end;
    a second resistor connected between said control input of said fourth transistor and said second terminal of said capacitor; and
    a third resistor connected between said second end of said controlled path of said fourth transistor and said first terminal of said capacitor.

2. The amplifier circuit according to claim 1, including a further capacitor coupling said control input of said fourth transistor to the first supply potential.

3. The amplifier circuit according to claim 1, including another capacitor coupling said second end of said controlled path of said fourth transistor to the first supply potential.

4. The amplifier circuit according to claim 1, including a fourth resistor connected between said control input and said second end of said controlled path of said second transistor for generating said bias potential.

5. The amplifier circuit according to claim 4, including an additional capacitor connected between said control input of said second transistor and the first supply potential.

6. The amplifier circuit according to claim 4, including a fifth resistor having a first terminal connected to one of the first supply potential and the second supply potential and a second terminal connected to a node point between said second resistor and said capacitor.

7. The amplifier circuit according to claim 6, including a series circuit having a controlled switch and a sixth resistor connected in series with said controlled switch, said series circuit connected in parallel with said first resistor.

8. The amplifier circuit according to claim 1, wherein said first transistor, said second transistor, said third transistor, and said fourth transistor are bipolar transistors, said first end and said second end of said controlled path of said bipolar transistors are formed by an emitter and collector, respectively, and said control input is formed by a base of said bipolar transistors.

* * * * *